US006830970B2

(12) United States Patent
Gardes

(10) Patent No.: US 6,830,970 B2
(45) Date of Patent: Dec. 14, 2004

(54) INDUCTANCE AND VIA FORMING IN A MONOLITHIC CIRCUIT

(75) Inventor: Pascal Gardes, Tours (FR)

(73) Assignee: STMicroelectronics, S.A., Montrouge (FR)

( * ) Notice: Subject to any disclaimer, the term of this patent is extended or adjusted under 35 U.S.C. 154(b) by 0 days.

(21) Appl. No.: 10/268,370

(22) Filed: Oct. 10, 2002

(65) Prior Publication Data
US 2003/0068884 A1 Apr. 10, 2003

(30) Foreign Application Priority Data

Oct. 10, 2001 (FR) .............................. 01 13055
Nov. 27, 2001 (FR) .............................. 01 15307
Jun. 14, 2002 (FR) .............................. 02 07383

(51) Int. Cl.[7] ...................... H01L 29/00; H01L 21/8234
(52) U.S. Cl. ...................... 438/238; 438/329; 438/667; 257/277; 257/531
(58) Field of Search .................... 438/238, 329, 438/622, 667, 957, 694, 697–788; 257/272–277, 528–535

(56) References Cited

U.S. PATENT DOCUMENTS

| 5,363,080 | A |   | 11/1994 | Breen |
| 5,398,400 | A |   | 3/1995 | Breen |
| 5,545,916 | A |   | 8/1996 | Koullias |
| 5,710,068 | A |   | 1/1998 | Hill |
| 5,811,868 | A |   | 9/1998 | Bertin et al. |
| 6,028,348 | A |   | 2/2000 | Hill |
| 6,114,937 | A | * | 9/2000 | Burghartz et al. .......... 336/200 |
| 6,236,103 | B1 |   | 5/2001 | Bernstein et al. |
| 6,274,937 | B1 |   | 8/2001 | Ahn et al. |
| 6,429,096 | B1 | * | 8/2002 | Yanagida ..................... 438/459 |
| 6,429,764 | B1 |   | 8/2002 | Karam et al. |
| 6,504,227 | B1 | * | 1/2003 | Matsuo et al. .............. 257/531 |
| 2001/0017395 | A1 |   | 8/2001 | Takamura |
| 2001/0023111 | A1 |   | 9/2001 | Yuan |

FOREIGN PATENT DOCUMENTS

EP  0 932 204 A1  7/1999
EP  1 054 417 A1  11/2000

OTHER PUBLICATIONS

French Preliminary Search Report from French Priority Application No. 01/15307, filed Nov. 27, 2001.
French Preliminary Search Report from French Priority Application No. 01/13055, filed Oct. 10, 2001.
French Preliminary Search Report from French Priority Application No. 02/07383, filed Jun. 14, 2002.
Patent Abstracts of Japan, vol. 014, No. 244 (E–0932) May 24, 1990 & JP 02 0677520, Mar. 7, 1990.
Patent Abstracts of Japan, vol. 018, No. 280 (E–1555) May 27, 1994 & JP 06 053414, Feb. 25, 1994.
Patent Abstracts of Japan, vol. 015, No. 187 (E–1062) May 14, 1991 & JP 03 048430, Mar. 1, 1991.
Patent Abstracts of Japan, vol. 013, No. 051 (E–712) Feb. 6, 1991 & JP 63 244761 Oct. 12, 1998.
Patent Abstracts of Japan, vol. 1999, No. 02, Feb. 26, 1999 & JP 10 303037, Nov. 13, 1998.
*Method for Inductive Coil Fabrication*, Kenneth Mason Publications, Hampshire, GB, No. 440, Dec. 2000, p. 2226 XP001052540.

* cited by examiner

Primary Examiner—Caridad Everhart
Assistant Examiner—Calvin Lee
(74) Attorney, Agent, or Firm—Lisa K. Jorgenson; William R. McClellan; Wolf, Greenfield & Sacks, P.C.

(57) ABSTRACT

A method for manufacturing, in a monolithic circuit including a substrate, an inductance and a through via, including the step of forming, from a first surface of the substrate, at least one trench according to the contour of the inductance to be formed; forming by laser in the substrate a through hole at the location desired for the via; simultaneously insulating the surface of the trench and of the hole; and depositing a conductive material in the trench and at least on the hole walls.

7 Claims, 2 Drawing Sheets

INDUCTANCE AND VIA FORMING IN A MONOLITHIC CIRCUIT

BACKGROUND OF THE INVENTION

1. Field of the Invention

The present invention relates to a method for manufacturing in a monolithic circuit a through via and an inductance. More specifically, it relates to an inductance of the type described in unpublished French patent application no. 01/13055 filed by the applicant on Oct. 10, 2001, which is incorporated herein by reference.

2. Discussion of the Related Art

The applicant has described in unpublished French patent application n°01/15307 filed on Nov. 27, 2001, which is incorporated herein by reference, a two-faced monolithic circuit associating active and passive components. Through vias enable establishing connections between the front surface and the rear surface.

FIGS. 1A and 1B show a cross-section view and a top view of the inductance of French patent application n°01/13055. Inductance 10 is formed from a trench etched in a substrate 11. The trench is conventionally obtained by anisotropic etching (for example, a plasma etching) which exposes a portion of substrate 11 according to a pattern of the type of that in FIG. 1B. The trench is insulated from substrate 11 by a conformal insulating layer 12, for example, a silicon oxide layer. The trench is then filled with a conductive material 15 forming inductance 10. The inductance has the shape of a spiral (circular or not) exhibiting first and second ends 16 and 17, first end 16 being substantially located at the center of the spiral.

When an inductance of the above type desired to a formed in a monolithic circuit comprised of one or several vias (not shown) crossing silicon substrate 11 to transfer contacts from one surface to the other, the number of manufacturing steps must be increased. Indeed, the size differences between the etchings necessary to the forming of inductance 10 and of vias (not shown) make it impossible to perform these etchings at the same time. Further, with usual etching processes using an etch mask, it is necessary to complete one of the two structures (inductance or via) before being able to etch the other structure. The holes or trenches formed must indeed be filled up to redeposit an etch mask of definition of the other structure.

The fact of having to form the two structures separately results in that only a single one of them can benefit from the advantages of having its conductive material insulated from the substrate by a thermal oxide formed at high temperature (on the order of 1000° C.). Indeed, if a second anneal step was carried out while one of the structures is completed, the high temperatures necessary would deteriorate this first structure.

SUMMARY OF THE INVENTION

The present invention aims at the forming of at least one inductance and of at least one through via in a monolithic circuit with common formation steps.

The present invention particularly aims at making the step of forming an insulating layer on the respective walls of the inductance trench and of the through holes of the vias common.

The present invention also aims at enabling formation of this insulating layer for coating the trenches and the vias with a same thermal oxide.

The present invention also aims at providing an inductance and via forming method in a monolithic circuit, which reduces or minimizes the number of manufacturing steps.

To achieve these and other objects, the present invention provides a method for manufacturing, in a monolithic circuit comprising a substrate, an inductance and a through via, in which is formed, from a first surface of the substrate, at least one trench according to the contour of the inductance to be formed; including the steps of forming, by laser in the substrate, a through hole at the location desired for the via; simultaneously insulating the surface of the trench and the hole; and depositing a conductive material in the trench and at least on the hole walls.

According to an embodiment of the present invention, the insulation is performed by thermal oxidation.

According to an embodiment of the present invention, the trench is formed by plasma etching.

According to an embodiment of the present invention, the step of deposition of a conductive material in the trench and on the walls of the holes is followed with a step of filling up the hole with an insulating material.

According to an embodiment of the present invention, the method further comprises a step of planarization of both surfaces of the substrate.

According to an embodiment of the present invention, a via is provided above a central end of the trench of the inductance.

The foregoing objects, features, and advantages of the present invention, will be discussed in detail in the following non-limiting description of specific embodiments in connection with the accompanying drawings.

DETAILED DESCRIPTION

The same elements and layers have been designated with the same references in the different drawings. For clarity, only those method steps and those components which are necessary to the understanding of the present invention have been illustrated and will be described hereafter. Further, in the different drawings, as usual in the field of monolithic circuit representation, the thicknesses and lateral dimensions of the various layers are not drawn to scale, neither within a same drawing, nor from one drawing to the other, to improve the readability of the drawings.

Figure 2A:
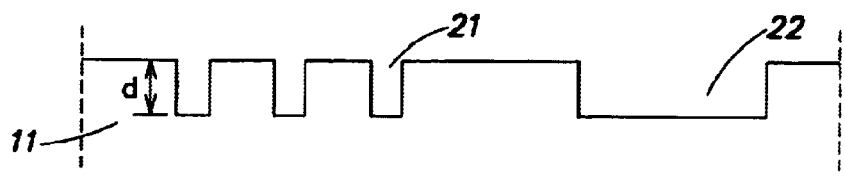
FIGS. 2A, 2B, 2C, 2D, and 2E illustrate, in cross-section views, successive steps of an implementation mode of the inductance and via forming method according to the present invention.

FIG. 2A shows a semiconductor substrate 11, for example, made of silicon, in which a trench 21 has been formed according to the pattern of an inductance to be formed and, optionally, a cavity 22 has been formed at the location of a via to be formed. Depth d of trench 21 (and of possible cavity 22) is a function of the desired inductance thickness. Trench 21 and cavity 22 are obtained by anisotropic etching, for example, by plasma, of substrate 11 covered with a mask which exposes regions 21 and 22.

Figure 2B:
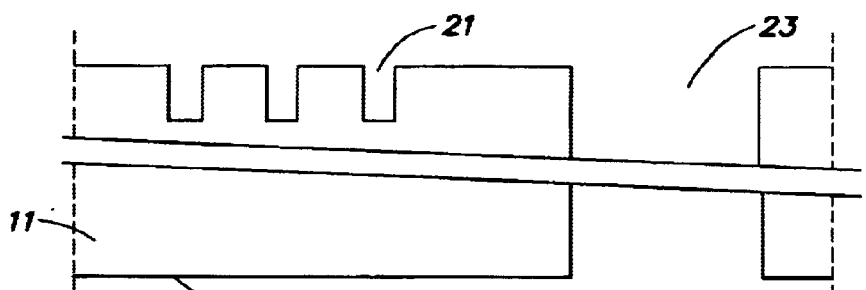

FIG. 2B illustrates the structure obtained at the end of a second step characteristic of the present invention, which comprises drilling one or several holes 23 crossing the substrate by means of a laser, at the locations desired for the vias.

The forming of trench 21 of the inductance by plasma etching enables taking advantage of the accuracy of such an etching. However, to form the through holes, advantage is taken of the laser drilling which requires no photolithographic mask to be performed.

The trench will, for example, have a depth from 7 to 15 µm and a width from 1 to 2 µm. The laser drilling provides a through hole of a diameter on the order of some twenty µm, or more.

According to a feature of the present invention, the steps of FIGS. 2A and 2B are performed successively and the laser drilling is performed without trench 21 being previously covered with a protection layer.

If a cavity 22 is formed by plasma etching at the location of the hole to be drilled, it may help the laser positioning.

Figure 2C:
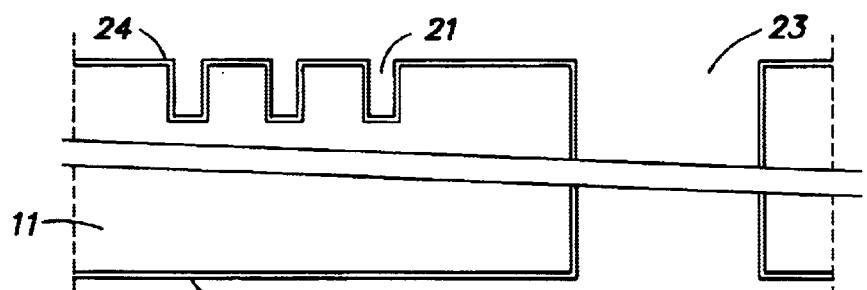

FIG. 2C illustrates a third step of the method of the present invention in which a conformal insulating layer 24, for example, a silicon oxide layer, is formed simultaneously at the level of trench 21 and of through hole 23.

According to a preferred implementation of the present invention, layer 24 is obtained by thermal oxidation. An essential advantage of the present invention should here be noted, which is to enable obtaining of a same insulator, and preferably of the same thermal oxide, on the walls of the via and inductance structures, and thus obtaining of the same electric qualities. This is made possible according to the present invention due to the fact that all recesses (trench 21 and holes 23) are formed without it being necessary to provide an additional step of protection of one of the two structures.

Figure 2D:
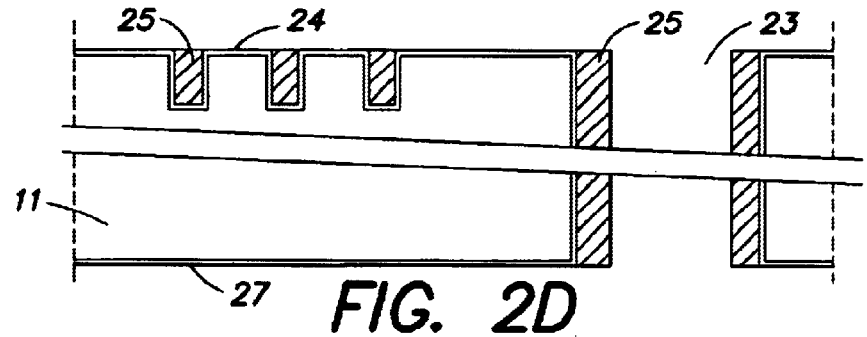

FIG. 2D illustrates the structure obtained after a fourth step of the method of the present invention, which comprises filling trench 21 with a conductive material 25. Preferably, material 25 is also arranged on the sides of via 23. Material 25 preferably is a metal, for example, copper, gold, nickel, aluminum, or titanium.

The deposition of metal 25 is preferably performed by electrolysis. In this case, a metal is first sputtered on the walls to be coated. A complete filling of trench 21 and the deposition of a conductive layer on the sides of hole 23 are obtained.

According to an alternative embodiment, metal 25 is entirely deposited by sputtering. In this case, it will be ascertained that the thickness of the material obtained inside of the via in the central region of substrate 11 is sufficient for conduction.

Figure 2E:
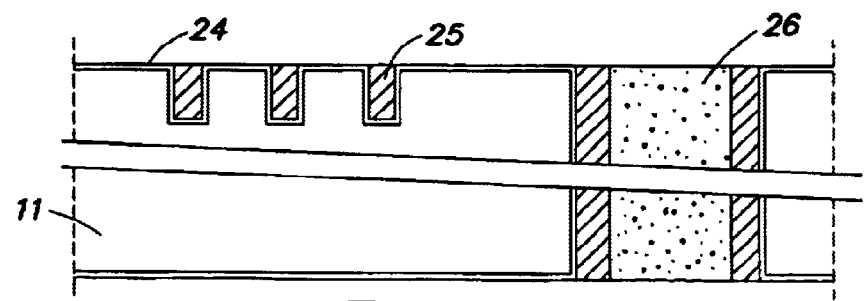

Then, as illustrated in FIG. 2E, the empty space remaining in through hole 23 is filled, preferably, with an insulating material 26 (for example, glass or resin).

After deposition of metal 25 and of insulating material 26, a step of planarization of the substrate surface at the level of the inductance and possibly on opposite surface 27 is implemented. The planarization may be performed by a chem-mech polishing process (CMP).

An inductance integrated to substrate 11 and insulated therefrom by layer 24 as well as a conductive via enabling contact transfer between the two surfaces of substrate 11 are thus obtained. The assembly exhibits substantially planar surfaces enabling subsequent forming of other passive or active components, and/or interconnection metallization levels, and/or ball grid arrays for a package of "flip-chip" type on one side or the other.

Figure 1A:
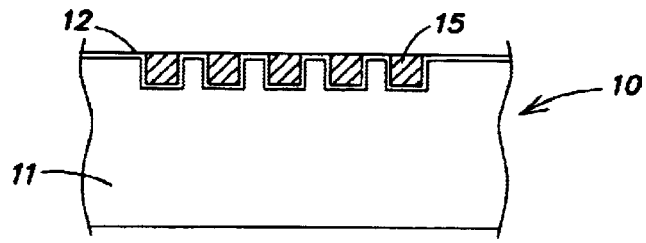
FIG. 1A, previously described, is a cross-section view of an inductance.
Figure 1B:
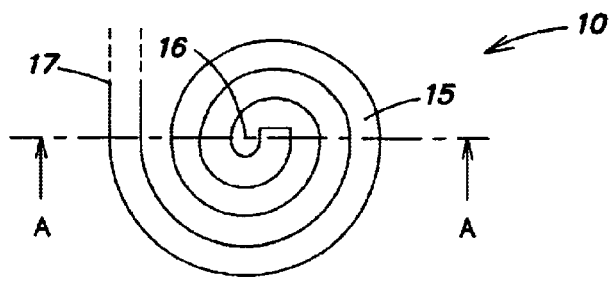
FIG. 1B, previously described, is a top view of the inductance of FIG. 1A.
Figure 3A:
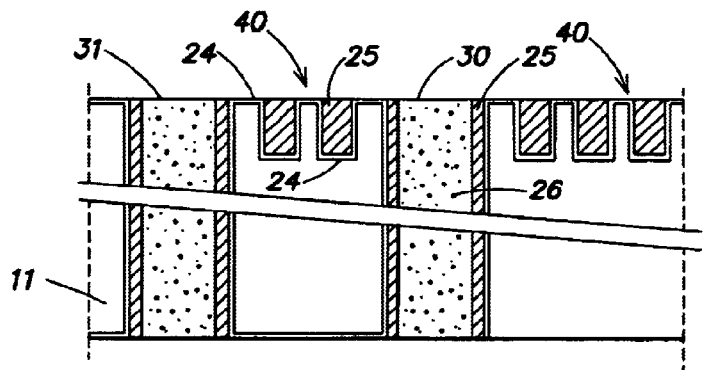
FIGS. 3A and 3B are respectively cross-section and top views illustrating an embodiment of an integrated inductance and vias in a monolithic circuit according to the present invention.
Figure 3B:
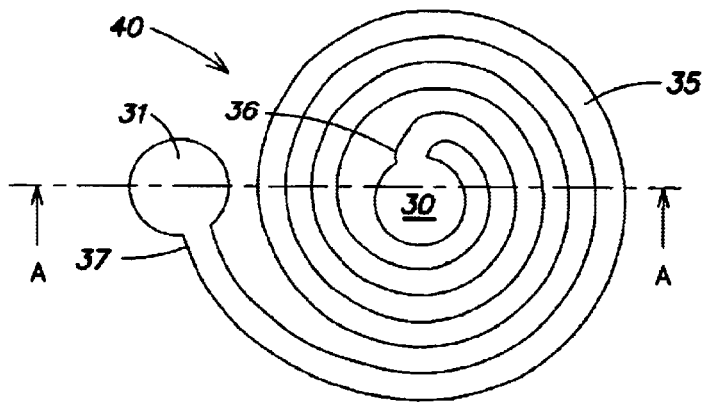

FIGS. 3A and 3B illustrate, respectively in a cross-section view and in a top view, a preferred embodiment of the present invention in which a via 30, drilled by laser according to the previously described method, is positioned approximately at the center of spiral 35 of an inductance 40 to connect central end 36 thereof by the opposite surface of substrate 11 to the other components or pads to which it must be connected.

In this example, a via 31 connecting external end 37 of spiral 35 to the opposite surface of substrate 11 has also been shown. The inductance connections are then all at the rear surface, opposite to the surface supporting inductance 40.

According to another example not shown where the connections are performed from the front surface, the contact of central end 36 of the spiral is transferred to the front surface outside of the structure by means of central via 30 of spiral 35 and of an external via, both vias being connected at the rear surface by a conductive track.

An advantage of the embodiment of FIGS. 3A and 3B is that it suppresses or eliminates possible stray capacitances linked to the forming of connections towards the central end of the inductive spiral on the front surface side of substrate 11.

Of course, the present invention is likely to have various alterations, modifications, and improvements which will readily occur to those skilled in the art. In particular, the practical implementation of the method of the present invention is within the abilities of those skilled in the art based on the functional indications given hereabove, be it to determine the dimensions (width, length, thickness) of the inductive spiral(s) or to determine the work conditions to be applied.

Further, although a single inductance and one via have been shown, several inductances and several vias may be formed. Further, the steps of inductance and via manufacturing according to the present invention may be inserted in a more general method for forming a monolithic circuit comprising other passive and/or active elements.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing an inductance and a through via in a monolithic circuit comprising a substrate, the method comprising:

forming at least one trench in a first surface of the substrate, the trench corresponding to a contour of the inductance;

forming by laser in the substrate a through hole at a location desired for the via;

simultaneously insulating a surface of the trench and the hole; and depositing a conductive material in the trench and at least on the hole walls, the conductive material in the trench forming the inductance.

2. The method of claim 1, wherein the insulation is performed by thermal oxidation.

3. The method of claim 1, wherein the trench is formed by plasma etching.

4. The method of claim 1, wherein the step of deposition of a conductive material in the trench and on the walls of the hole is followed with a step of filling up the hole with an insulating material.

5. The method of claim 1, further comprising a step of planarization of both surfaces of the substrate.

6. The method of claim 1, wherein a via is provided above a central end of the trench of the inductance.

7. The method of claim 1, wherein the substrate comprises silicon.

* * * * *

UNITED STATES PATENT AND TRADEMARK OFFICE
CERTIFICATE OF CORRECTION

PATENT NO. : 6,830,970 B2
DATED : December 14, 2004
INVENTOR(S) : Pascal Gardes

It is certified that error appears in the above-identified patent and that said Letters Patent is hereby corrected as shown below:

<u>Column 1,</u>
Line 34, should read -- When an inductance of the above type is desired to be formed --

Signed and Sealed this

Thirty-first Day of May, 2005

JON W. DUDAS
*Director of the United States Patent and Trademark Office*